United States Patent
Jeong

(10) Patent No.: US 9,577,145 B2
(45) Date of Patent: Feb. 21, 2017

(54) SEMICONDUCTOR LIGHT EMITTING DEVICE

(75) Inventor: Hwan Hee Jeong, Ulsan (KR)

(73) Assignee: LG INNOTEK CO., LTD., Seoul (KR)

( * ) Notice: Subject to any disclaimer, the term of this patent is extended or adjusted under 35 U.S.C. 154(b) by 761 days.

(21) Appl. No.: 12/536,859

(22) Filed: Aug. 6, 2009

(65) Prior Publication Data

US 2010/0163893 A1 Jul. 1, 2010

(30) Foreign Application Priority Data

Aug. 12, 2008 (KR) .................. 10-2008-0079129

(51) Int. Cl.
*H01L 33/00* (2010.01)
*H01L 33/08* (2010.01)
*H01L 33/38* (2010.01)

(52) U.S. Cl.
CPC ............. *H01L 33/08* (2013.01); *H01L 33/387* (2013.01)

(58) Field of Classification Search
USPC ............... 257/91, 93, 99, E3.055, E33.055, 257/E33.064, E33.067
See application file for complete search history.

(56) References Cited

U.S. PATENT DOCUMENTS

| | | |
|---|---|---|
| 4,775,645 A | 10/1988 | Kurata et al. |
| 6,818,531 B1 | 11/2004 | Yoo et al. |
| 2003/0141506 A1 | 7/2003 | Sano et al. |
| 2007/0018190 A1* | 1/2007 | Kim et al. ............. 257/99 |
| 2007/0126013 A1 | 6/2007 | Kim et al. |
| 2007/0200122 A1 | 8/2007 | Kim et al. |
| 2007/0295952 A1 | 12/2007 | Jang et al. |
| 2008/0261378 A1 | 10/2008 | Yao et al. |
| 2009/0315045 A1 | 12/2009 | Horie |
| 2010/0163893 A1* | 7/2010 | Jeong ............. H01L 33/08 257/91 |

FOREIGN PATENT DOCUMENTS

| | | |
|---|---|---|
| CN | 1941443 A | 4/2007 |
| CN | 101026213 A | 8/2007 |
| CN | 101180420 A | 5/2008 |
| EP | 1 596 441 A2 | 11/2005 |
| JP | 2007-324577 A | 12/2007 |
| KR | 10-2004-0104232 A | 12/2004 |
| KR | 10-0727472 B1 | 6/2007 |
| KR | 10-2007-0116687 A | 12/2007 |
| KR | 10-2010-0020 * | 8/2010 |
| WO | WO 2007/126092 A1 | 11/2007 |

* cited by examiner

*Primary Examiner* — Hrayr A Sayadian
(74) *Attorney, Agent, or Firm* — Birch, Stewart, Kolasch & Birch, LLP

(57) ABSTRACT

Provided is a semiconductor light emitting device.
The semiconductor light emitting device comprises a second electrode layer; a light emitting structure comprising a plurality of compound semiconductor layers under the second electrode layer; at least one dividing groove that divides inner areas of the lower layers of the light emitting structure into a plurality of areas; and a first electrode under the light emitting structure.

18 Claims, 9 Drawing Sheets

SEMICONDUCTOR LIGHT EMITTING DEVICE

CROSS-REFERENCE TO RELATED APPLICATIONS

The present application claims priority under 35 U.S.C. 119 to Korean Patent Application No. 10-2008-0079129 (filed on Aug. 12, 2008), which is hereby incorporated by reference in its entirety.

BACKGROUND

Embodiments relate to a semiconductor light emitting device.

A III-V group nitride semiconductor has been variously applied as an optical device comprising blue/green light emitting diode (LED), high-speed switching devices such as a metal semiconductor field effect transistor (MOSFET), a hetero junction field effect transistor (HEMT), etc., and a light source of lighting and a display apparatus, etc. In particular, a light emitting device using the III group nitride semiconductor can implement a high efficiency light emission, having a direct transition type band gap that correspond to the region from visible rays to ultraviolet rays.

The nitride semiconductor has been mainly used as a light emitting diode (LED) or a laser diode (LD), and studies for improving a manufacturing process or optical efficiency have been continued.

SUMMARY

Embodiments provide a semiconductor light emitting device that can divide a light emitting portion of a chip into a plurality of light emitting areas.

Embodiments provide a semiconductor light emitting device that can improve external quantum efficiency through a plurality of light emitting areas.

Embodiments provide a semiconductor light emitting device that can be light-emitted through a plurality of divided areas by forming a structure dividing groove having a depth that divides an inner side of a light emitting structure into a plurality of areas.

Embodiments provide a semiconductor light emitting device that can improve electrical reliability by disposing an ohmic contact layer at an inner side between a light emitting structure and a second electrode layer and/or disposing a protecting layer at an outer side therebetween.

An embodiment provides a semiconductor light emitting device comprising: a second electrode layer; a light emitting structure comprising a plurality of compound semiconductor layers formed under the second electrode layer; at least one dividing groove that divides inner areas of the lower layers of the light emitting structure into a plurality of areas; and a first electrode under the light emitting structure.

An embodiment provides a semiconductor light emitting device comprising: a second electrode layer comprising a reflective electrode; an ohmic contact layer under the second electrode layer; a light emitting structure comprising a plurality of compound semiconductor layers comprising a second conductive type semiconductor layer under the ohmic contact layer; at least one dividing groove that divides inner areas of the lower layers of the light emitting structure into a plurality of areas; and a first electrode the light emitting structure.

An embodiment provides a semiconductor light emitting device comprising: a conductive supporting member; a second electrode layer comprising a reflective electrode under the conductive supporting member; an ohmic contact layer under at least a portion of the second electrode layer; a light emitting structure comprising a plurality of compound semiconductor layers under the ohmic contact layer; and a plurality of dividing grooves spaced from each other on the inner sides of the lower layers of the light emitting structure, having a predetermined depth.

An embodiment provides a semiconductor light emitting device, comprising a conductive supporting member; a second electrode layer disposed under a bottom surface of the conductive supporting member; a light emitting structure comprising a first conductive type semiconductor layer disposed under a bottom surface of the second electrode layer, a second conductive type semiconductor layer between the first conductive type semiconductor layer and the second electrode layer, and an active layer between the first and second conductive type semiconductor layers; at least one groove disposed in an inner region of the light emitting structure; and a first electrode disposed under a bottom surface of the light emitting structure, wherein the groove has a depth from a bottom surface of the first conductive type semiconductor layer to a portion of the second conductive type semiconductor layer, the groove being in the second conductive type semiconductor layer, wherein the depth of the groove in the second conductive type semiconductor layer is less than a thickness of the second conductive type semiconductor layer, and wherein the groove has a length shorter than that of the light emitting structure.

An embodiment provides a semiconductor light emitting device, comprising a conductive supporting member; a second electrode layer comprising a reflective electrode disposed under a bottom surface of the conductive supporting member; an ohmic contact layer disposed under a bottom surface of the second electrode layer; a light emitting structure disposed under a bottom surface of the ohmic contact layer, wherein the light emitting structure comprises a first conductive type semiconductor layer disposed under the bottom surface of the ohmic contact layer, a second conductive type semiconductor layer between the first conductive type semiconductor layer and the ohmic contact layer, and an active layer between the first and second conductive type semiconductor layers; a plurality of grooves spaced apart from each other in an inner region of the light emitting structure; and a first electrode under a bottom surface of the light emitting structure, wherein the plurality of grooves has a depth from a bottom surface of the first conductive type semiconductor layer to a portion of the second conductive type semiconductor layer, the plurality of grooves being in the second conductive type semiconductor layer, wherein the depth of each of the plurality of grooves in the second conductive type semiconductor layer is less than a thickness of the second conductive type semiconductor layer, wherein each of the grooves has a length shorter than that of the light emitting structure, and wherein the conductive supporting member has a width wider than that of the light emitting structure.

An embodiment provides a semiconductor light emitting device, comprising a conductive supporting member; a second electrode layer comprising a reflective electrode disposed under a bottom surface of the conductive supporting member; an ohmic contact layer disposed under a portion of the second electrode layer; a light emitting structure disposed under a bottom surface of the ohmic contact layer, wherein the light emitting structure comprises a first conductive type semiconductor layer disposed under the bottom surface of the ohmic contact layer, a second conductive type semiconductor layer between the first conductive type semiconductor layer and the ohmic contact layer, and an active layer between the first and second conductive type semiconductor layers; and a plurality of grooves spaced from each other in an inner region of the light emitting structure, wherein the plurality of grooves has a depth from a bottom surface of the first conductive type semiconductor layer to a portion of the second conductive type semiconductor layer, the plurality of grooves being in the second conductive type semiconductor layer, wherein the depth of each of the plurality of grooves in the second conductive type semiconductor layer is less than a thickness of the second conductive type semiconductor layer, wherein each of the grooves has a length shorter than that of the light emitting structure, and wherein the conductive supporting member and the second electrode layer have a width wider than that of the light emitting structure.

The details of one or more embodiments are set forth in the accompanying drawings and the description below. Other features will be apparent from the description and drawings, and from the claims.

DETAILED DESCRIPTION OF THE EMBODIMENTS

Figure 1:
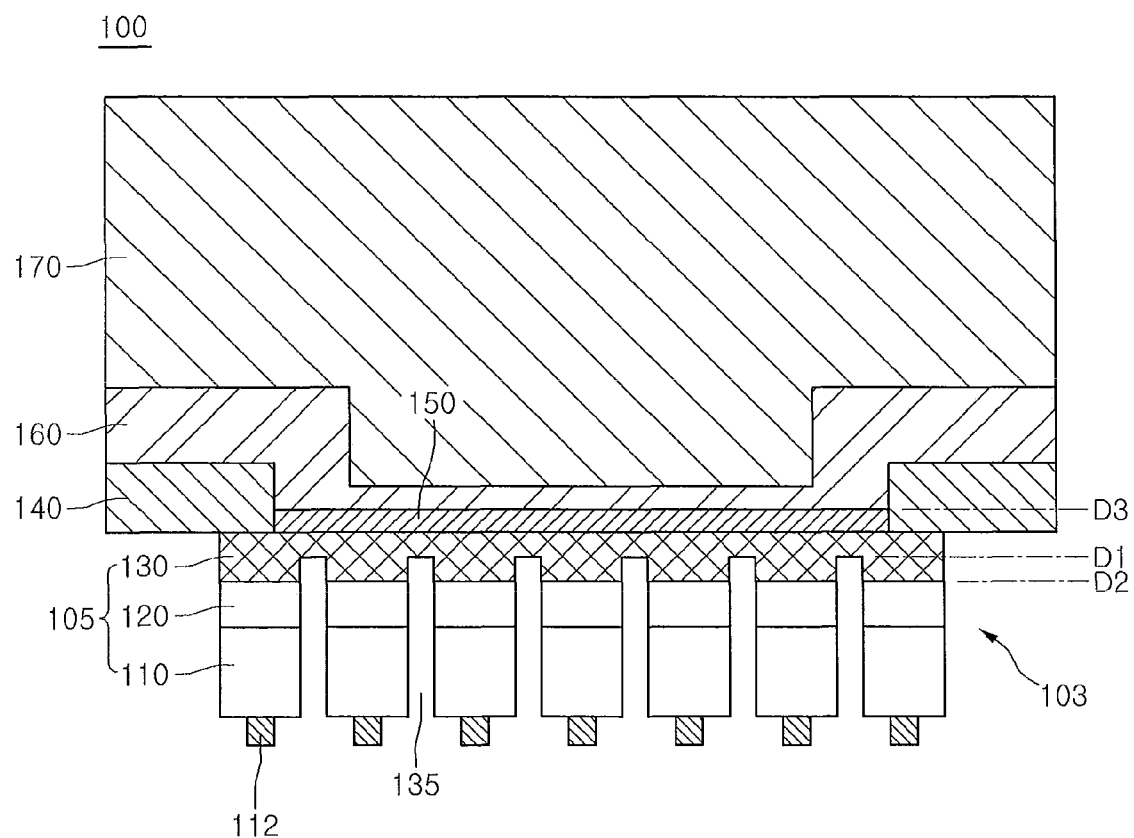
FIG. 1 is a side cross-sectional view showing a semiconductor light emitting device according to the first embodiment.

Hereinafter, a semiconductor light emitting device according to embodiments will be described with reference to the accompanying drawings. Hereinafter, when explaining embodiments, the reference referred to as being on or under each layer may be explained with reference to the drawings, and the thickness of each layer is also explained by way of example, but it not limited to the thickness shown in the drawings.

In embodiments, when each layer (film), region, pattern or structures are referred to as being "on" or "under" substrate, each layer (film), region, pad or pattern, being "on" and "under" comprises meanings of "directly" and "indirectly".

FIG. 1 is a side cross-sectional view showing a semiconductor light emitting device according to the first embodiment. And FIG. 2 is a plan view of FIG. 1

Figure 2:
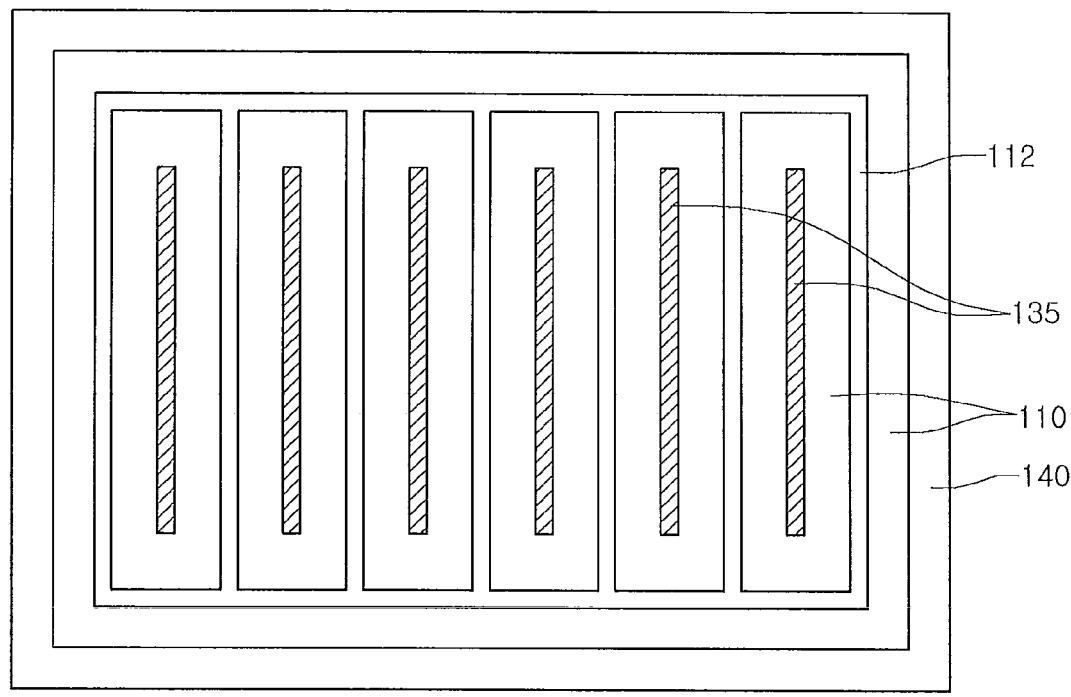
FIG. 2 is a plan view of FIG. 1.

Referring to FIGS. 1 and 2, the semiconductor light emitting device 100 comprises a light emitting structure 105, first electrodes 112, a protecting layer 140, an ohmic contact layer 150, a second electrode layer 160, and a conductive supporting member 170.

The semiconductor light emitting device 100 comprises a plurality of compound semiconductor, for example, a LED using a III-V group compound semiconductor, wherein the LED may be a colored LED that emits light having blue, green, red, etc. or a UV LED. The light emitted from the LED may be implemented variously within the technical scope of embodiments.

The light emitting structure 105 comprises a first conductive type semiconductor layer 110, an active layer 120, and a second conductive type semiconductor layer 130.

The first conductive type semiconductor layer 110 may be selected from a III-V group compound semiconductor doped with a first conductive dopant, for example, GaN, AlN, AlGaN, InGaN, InN, InAlGaN, AlInN, AlGaAs, GaP, GaAs, GaAsP, AlGaInP, etc. When the first conductive type is an N-type semiconductor layer, the first conductive type dopant comprises a N-type dopant such as Si, Ge, Sn, Se, Te, etc. The first conductive type semiconductor layer 110 may be formed in a single layer or a multi layer, but it is not limited thereto.

First electrode 112 may be formed with a predetermined pattern under the first conductive type semiconductor layer 110. A roughness pattern may be formed on the bottom surface of the first conductive type semiconductor layer 110.

The active layer 120 is formed on the first conductive type semiconductor layer 110, wherein the active layer 120 may be formed having a single quantum well structure or a multi quantum well structure. The active layer 120 may be formed having a period of a well layer/a barrier layer using the III-V group compound semiconductor material, for example, having a period of InGaN well layer/GaN barrier layer, InGaN well layer/AlGaN barrier layer, or InGaN well layer/InGaN barrier layer. A conductive clad layer may be formed on and/or under the active layer 120, wherein the conductive clad layer may be formed of AlGaN based semiconductor.

The second conductive type semiconductor layer 130 is formed on the active layer 120, wherein the second conductive type semiconductor layer 130 may be selected from the III-V group compound semiconductor doped with a second conductive dopant, for example, GaN, AlN, AlGaN, InGaN, InN, InAlGaN, AlInN, AlGaAs, GaP, GaAs, GaAsP, and AlGaInP, etc. When the second conductive type is a P-type semiconductor layer, the second conductive type dopant comprises a P-type dopant such as Mg and Ze, etc. The second conductive type semiconductor layer 130 may be formed in a single layer or a multi layer, but it is not limited thereto. The second conductive type semiconductor layer 130 may be formed having a thickness of 500 Å to 3000 Å.

The light emitting structure 105 may comprise a N-type semiconductor layer or a P-type semiconductor layer on the second conductive type semiconductor layer 120. The first conductive type semiconductor layer 100 may also be implemented as a P-type semiconductor layer and the second conductive type semiconductor layer 130 may also be implemented as a N-type semiconductor layer. The light emitting structure 105 may comprise at least one of a N-P junction structure, a P-N junction structure, N-P-N junction structure, and a P-N-P junction structure.

The ohmic contact layer 150 may be formed on the second conductive type semiconductor layer 130 or the third conductive type semiconductor, and the protecting layer 140 may be formed at an outer circumference of the ohmic contact layer 150.

The ohmic contact layer 150, which may be formed in a layer shape or in a plural pattern shape, is ohmic-contacted on the second conductive type semiconductor layer 130. When the ohmic contact layer 150 is formed in a plural pattern shape, the second conductive type semiconductor layer 130 may contact directly the ohmic contact layer 150 having different ohmic characteristics and the second electrode layer 160.

The ohmic contact layer 150 may comprise at least any one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

The ohmic contact layer 150 may be formed having a thickness of 10 Å to 1 um, but it is not limited thereto.

The protecting layer 140 may be formed of insulating material or transparent conductive material. The insulating material may use, for example, SiOx, SiNx, $Al_2O_3$, $TiO_2$, etc. The transparent conductive material may comprise, for example, at least any one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

The protecting layer 140 is formed on the outer circumference of the top surface of the second conductive type semiconductor layer 130. The protecting layer 140 is formed in a ring configuration, a loop configuration, a frame configuration, etc. along the outer circumference of the top surface of the second conductive type semiconductor layer 130. In this case, the inner end of the protecting layer 140 is formed on the top surface of the second conductive type semiconductor layer 130, and the outer end thereof is exposed to the outer side of the light emitting structure 105.

The protecting layer 140 may be formed having a thickness of 0.1 to 2 um, but it may be changed within the technical range of embodiments.

The thickness of the protecting layer 140 allows the interval between the second electrode layer 160 and the light emitting structure 105 to be spaced, making it possible to improve the problem of electrical short at the outer wall of the light emitting structure 105.

The outer part 103 of the light emitting structure 105 is a space etched on the circumference of the structure, wherein the top surface of the protecting layer 140 may be exposed to the space. Thereby, it brings an effect that moves the light emitting structure 105 to the inner side of the chip. In this case, the interval between the light emitting structure 105 and the second electrode layer 160 may further be spaced.

A second electrode layer 160 is formed on the ohmic contact layer 150 and the protecting layer 140, and a conductive supporting member 170 is formed on the second electrode layer 160. The second electrode layer 160 may be selected from Ag, Ni, Al, Rh, Pd, Ir, Ru, Mg, Zn, Pt, Au, Hf, and material consisting of a selective combination thereof. The conductive supporting member 170 may be used as a base substrate of the chip, being used as a path that supplies power of a second polarity. The second electrode layer 160 and/or the conductive supporting member 170 may be formed in a layer shape or in a plural pattern shape.

The conductive supporting member 170 may be implemented as copper (Cu), gold (Au), nickel (Ni), molybdenum (Mo), copper-tungsten (Cu—W), carrier wafers (e.g.: Si, Ge, GaAs, ZnO, and Sic etc.). The conductive supporting member 170 may be formed using an electrodeposition method or in a sheet shape, but it is not limited thereto. The conductive supporting member 170 may be formed having a thickness of 30 to 150 um, but it is not limited thereto.

Structure dividing grooves 135 are formed in the inner side of the light emitting structure 105. The structure dividing grooves 135 are formed in a groove shape having a predetermined depth from the lower end of the first conductive type semiconductor layer 110 to a portion of the second conductive type semiconductor layer 130. The structure dividing grooves may be formed having a width of 0.1 um to 100 um.

Herein, the depth D1 of the structure dividing groove 135 may be formed to be deeper than the lower end position D2 of the second conductive type semiconductor layer 130 and to be shallower than the upper end position D3 of the ohmic contact layer 150. In other words, the structure dividing groove 135 is formed in a depth which the second electrode is not exposed. In this case, making it possible to prevent that fragments of the second electrode layer short the interlayer of the light emitting structure 105. The ohmic contact layer 150 is disposed between the structure dividing groove 135 and the second electrode layer 160, making it possible to solve problems according to the etched depth of the structure dividing groove 135.

The first electrode 112 is formed on the bottom surface of the first conductive type semiconductor layer 110 in a predetermined pattern, wherein it may be disposed on the circumference of the structure dividing groove 135.

Referring to FIG. 2, a plurality of structure dividing grooves 135 are disposed in the inner side area of the first conductive type semiconductor layer 110, wherein the structure dividing grooves 135 may be formed in a shape that the first conductive type semiconductor layer 110 is not separated into two. The structure dividing grooves 135 may be formed in straight line configuration, in a bent configuration (e.g.: L and V), in a branched branch configuration, in a multi-branch windows configuration (e.g.: E and F), in an open type characters configuration (e.g.: Y, N, M, V, T, W, X, Z, C, H, K, etc.), etc., but it is not limited thereto.

The plurality of structure dividing grooves 135 may be in parallel to each other or not, and may be spaced at regular/irregular intervals, but they are not limited thereto.

The light emitting structure 105 may be divided into a plurality of light emitting areas by the structure dividing grooves 135.

The first electrode 112 is disposed on the divided areas of the first conductive type semiconductor layers 110, respectively, wherein they may be disposed on one side or the other side of the divided areas by the structure dividing grooves 135 or along the circumference thereof. Herein, the first electrode 112 may be disposed in various patterns, for example, in a polygonal pattern, in a circular pattern, in a curve pattern, in a straight line pattern, in a multi-branch windows pattern, in a bent-shaped pattern, in a character-shaped pattern (e.g.: O, T, Y, D, B, X, Z, U, P, L, K, M, N, etc.), etc.

The light emitting structure 105 may be divided into a plurality of light emitting areas to minimize light scattering inside the device, making it possible to improve optical efficiency. Also, light is emitted through the plurality of light emitting areas, making it possible to improve external quantum efficiency.

FIGS. 3 to 10 are diagrams showing a manufacturing process of a semiconductor light emitting device according to the first embodiment.

Figure 3:
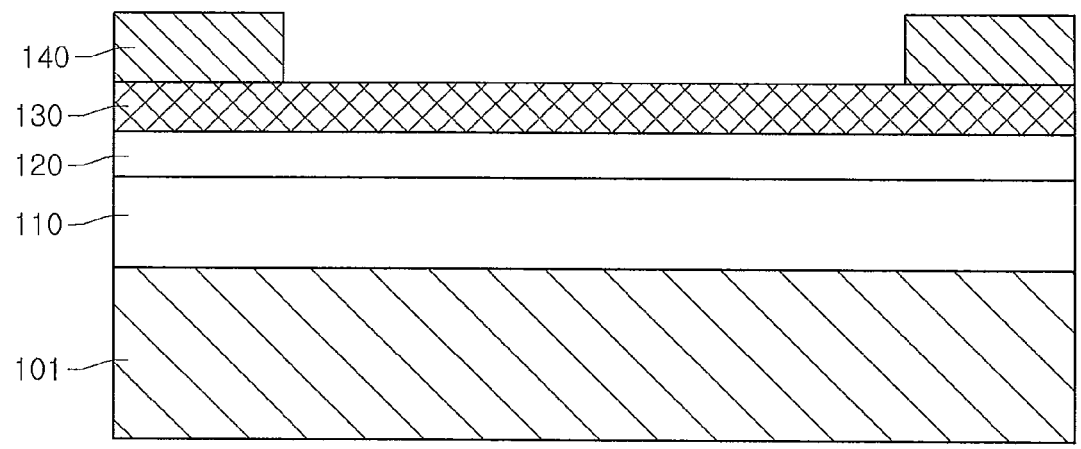
FIGS. 3 to 11 are diagrams showing a manufacturing process of a semiconductor light emitting device according to the first embodiment.
Figure 4:
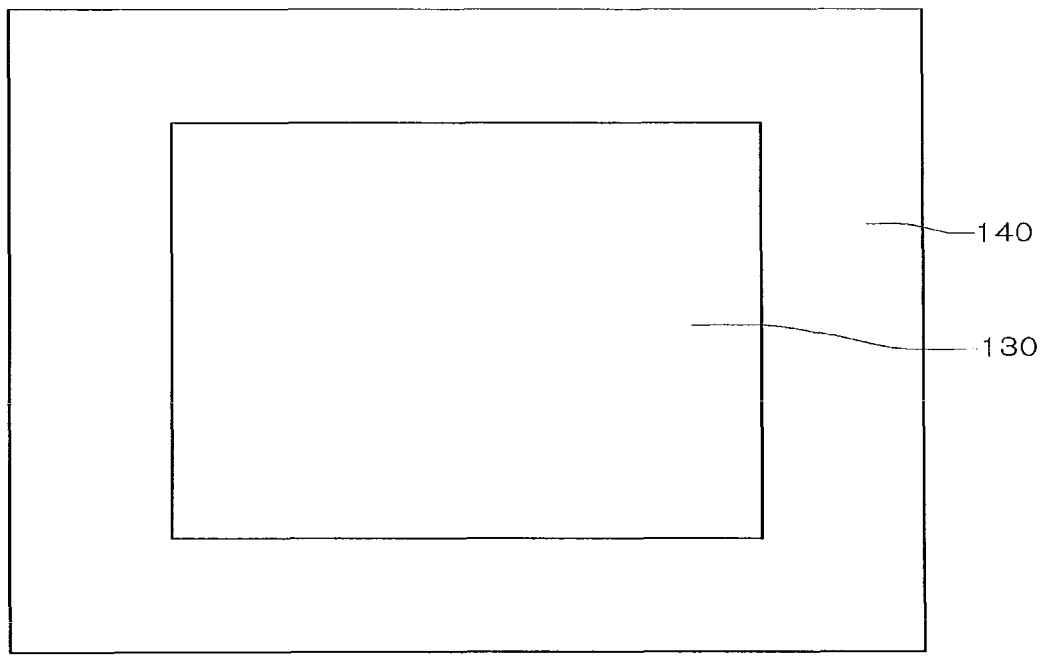

Referring to FIGS. 3 and 4, a substrate 101 is loaded in the growth equipment and an II to VI group compound semiconductor may be formed thereon in a layer shape or in a pattern shape.

The semiconductor light emitting device may be formed by the growth equipment such as an electron beam evaporator, a physical vapor deposition (PVD), a chemical vapor deposition (CVD), a plasma laser deposition (PLD), a dualtype thermal evaporator, a sputtering, and a metal organic chemical vapor deposition (MOCVD), etc., but the growth equipment is not limited thereto.

The substrate 101 may be selected from a group consisting of sapphire substrate ($Al_2O_3$), GaN, SiC, ZnO, Si, GaP, InP, $Ga_2O_3$, a conductive substrate, and GaAs, etc. An unevenness pattern may be formed on the top surface of the substrate 101. Also, a layer or a pattern using the II to VI group compound semiconductor, for example, at least one layer of a ZnO layer (not shown), a buffer layer (not shown), an undoped semiconductor layer (not shown), may also be formed on the substrate 101.

The buffer layer or the updoped semiconductor layer may be formed using a III-V group compound semiconductor, wherein the buffer layer reduces the difference in lattice constant with the substrate and the undoped semiconductor layer may be formed of undoped GaN based semiconductor A plurality of compound semiconductor layers are formed on the substrate 101. A first conductive type semiconductor layer 110 is formed on the substrate 101, an active layer 120 is formed on the first conductive type semiconductor layer 110, and a second conductive type semiconductor layer 130 is formed on the active layer 120.

The first conductive type semiconductor layer 110 may be selected from the III-V group compound semiconductor doped with a first conductive dopant, for example, GaN, AlN, AlGaN, InGaN, InN, InAlGaN, AlInN, AlGaAs, GaP, GaAs, GaAsP, and AlGaInP, etc. When the first conductive type is a N-type semiconductor layer, the first conductive type dopant comprises a N-type dopant such as Si, Ge, Sn, Se, and Te, etc. The first conductive type semiconductor layer 110 may be formed in a single layer or a multi layer, but it is not limited thereto.

The active layer 120 is formed on the first conductive type semiconductor layer 110, wherein the active layer 120 may be formed having a single quantum well structure or a multi quantum well structure.

The active layer 120 may be formed having a period of a well layer/a barrier layer using the III-V group compound semiconductor material, for example, having a period of InGaN well layer/GaN barrier layer or InGaN well layer/ InGaN barrier layer.

A conductive clad layer may be formed on and/or under the active layer 120, wherein the conductive clad layer may be formed on an AlGaN based semiconductor.

The second conductive type semiconductor layer 130 is formed on the active layer 120, wherein the second conductive type semiconductor layer 130 may be selected from the III-V group compound semiconductor doped with a second conductive dopant, for example, GaN, AlN, AlGaN, InGaN, InN, InAlGaN, AlInN, AlGaAs, GaP, GaAs, GaAsP, and AlGaInPO, etc. When the second conductive type is a P-type semiconductor layer, the second conductive type dopant comprises a P-type dopant such as Mg and Ze, etc. The second conductive type semiconductor layer 130 may be formed in a single layer or a multi layer, but it is not limited thereto.

The first conductive type semiconductor layer 110, the active layer 120, and the second conductive type semiconductor layer 130 may be defined as a light emitting structure. Also, a third conductive type semiconductor layer, for example, a N-type semiconductor layer or a P-type semiconductor layer, may be formed on the second conductive type semiconductor layer 130. Therefore, the light emitting structure may be formed in at least one of a N-P junction structure, a P-N junction structure, N-P-N junction structure, and a P-N-P junction structure.

A protecting layer 140 is formed at the outer side of the top surface of the second conductive type semiconductor layer 130 or the third conductive type semiconductor layer, wherein the protecting layer 140 may be formed of insulating material or transparent conductive material. The insulating material may use, for example, $SiO_x$, $SiN_x$, $Al_2O_3$, $TiO_2$, etc. The transparent conductive material may comprise, for example, at least any one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

FIG. 4 is a plan view of FIG. 3. As shown in FIG. 4, the protecting layer 140 is formed in a ring configuration, a hook configuration, a frame configuration, etc. along the outer circumference of the top surface of the second conductive type semiconductor layer 130.

The protecting layer 140 may be formed having a thickness of 0.1 to 2 um, but it is not limited thereto.

Figure 5:
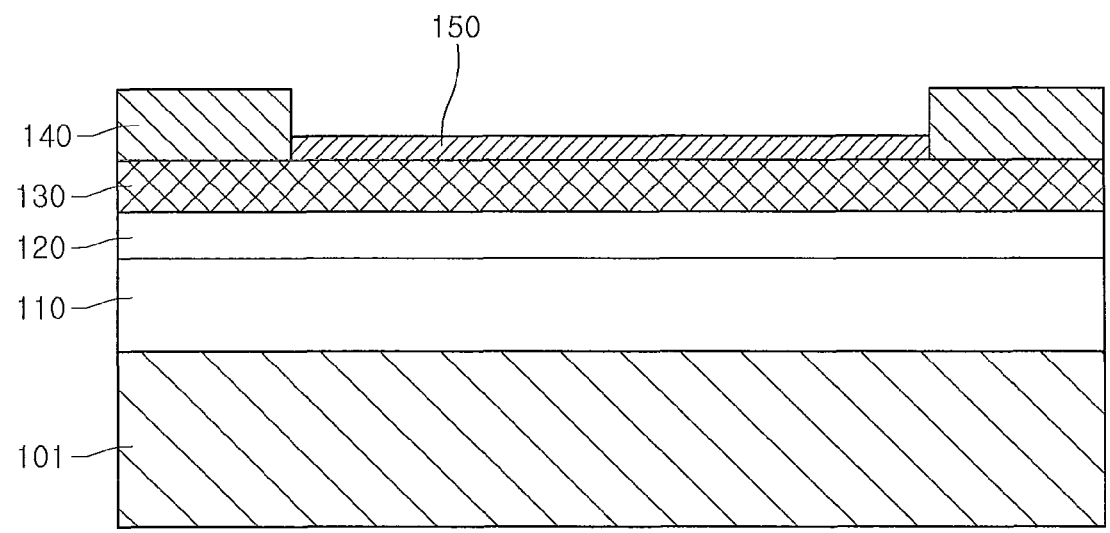

Referring to FIG. 5, an ohmic contact layer 150 is formed in the inner side on the second conductive type semiconductor layer 130 or the third conductive type semiconductor layer. The ohmic contact layer 150, which may be formed in a layer shape or in a plural pattern shape, is ohmic-contacted The ohmic contact layer 150 may comprise, for example, at least any one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

Herein, the protecting layer 140 may be formed on the second conductive type semiconductor layer 130, after the ohmic contact layer 150 is formed thereon, but the forming order is not limited thereto.

Figure 6:
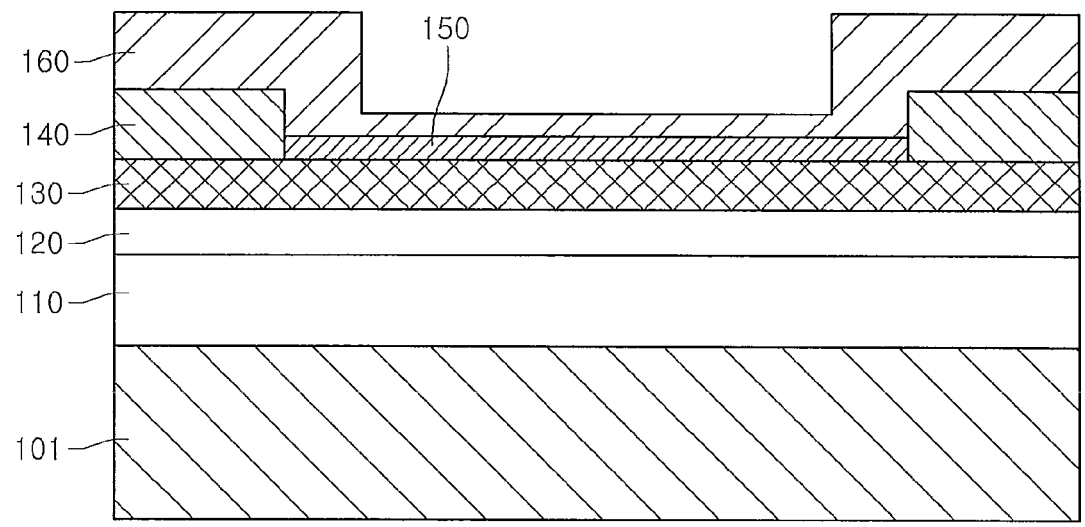
Figure 7:
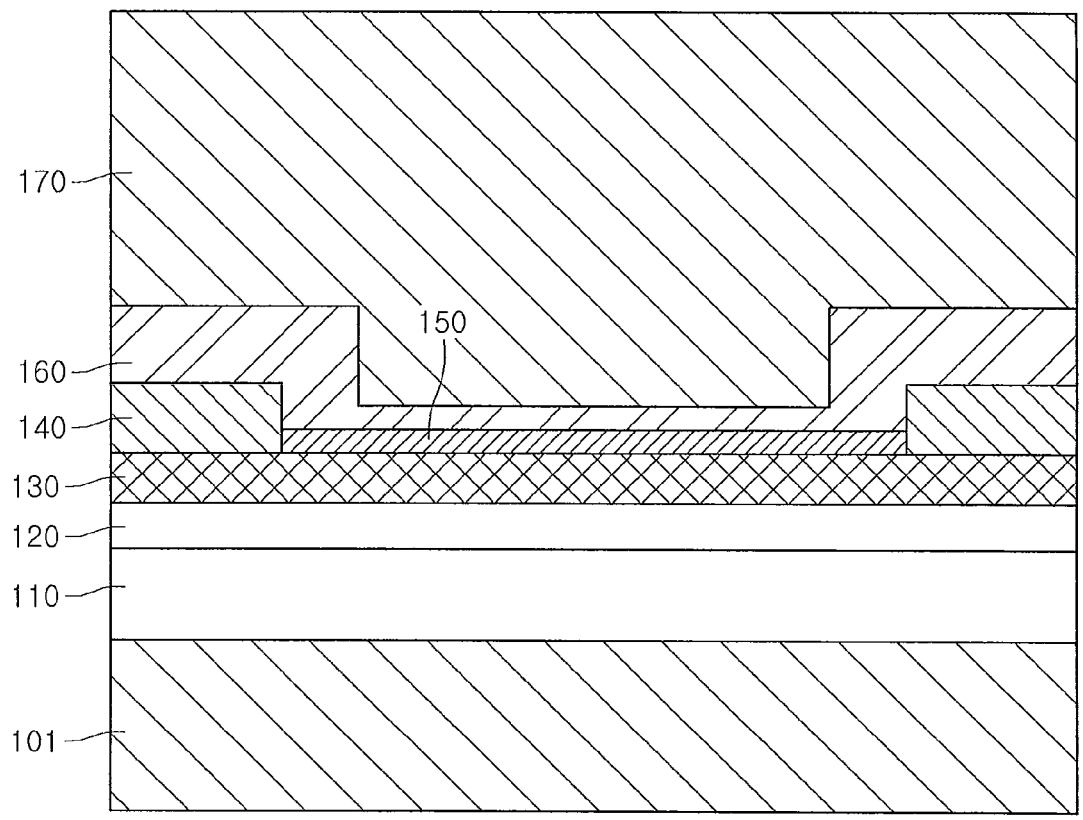

Referring to FIGS. 6 and 7, a second electrode layer 160 is formed on the protecting layer 140 and the ohmic contact layer 150, wherein the second electrode layer 160 may be selectively formed from Ag, Ni, Al, Rh, Pd, Ir, Ru, Mg, Zn, Pt, Au, Hf and material consisting of a selective combination thereof.

A conductive supporting member 170 having a predetermined thickness may be formed on the second electrode layer 160, wherein the conductive supporting member 170 may be used as a base substrate of the chip, being used as a path that supplies power of a second polarity. The second electrode layer 160 and/or the conductive supporting member 170 may be formed in a layer shape or in a plural pattern shape.

When the ohmic contact layer 150 is formed in a pattern, the second electrode layer 160 may contact directly the top of the second conductive type semiconductor layer 130. Therefore, current efficiency can be improved on the second conductive type semiconductor layer 130 using the difference in ohmic resistance between the second electrode layer 160 and the ohmic contact layer 150.

The conductive supporting member 170 may be implemented as copper (Cu), gold (Au), nickel (Ni), molybdenum (Mo), copper-tungsten (Cu—W), carrier wafers (e.g.: Si, Ge, GaAs, ZnO, and Sic etc.). The conductive supporting member 170 may be formed using an electrodeposition method or in a sheet shape, but it is not limited thereto. The conductive supporting member 170 may be formed having a thickness of 30 to 150 um, but it is not limited thereto.

Figure 8:
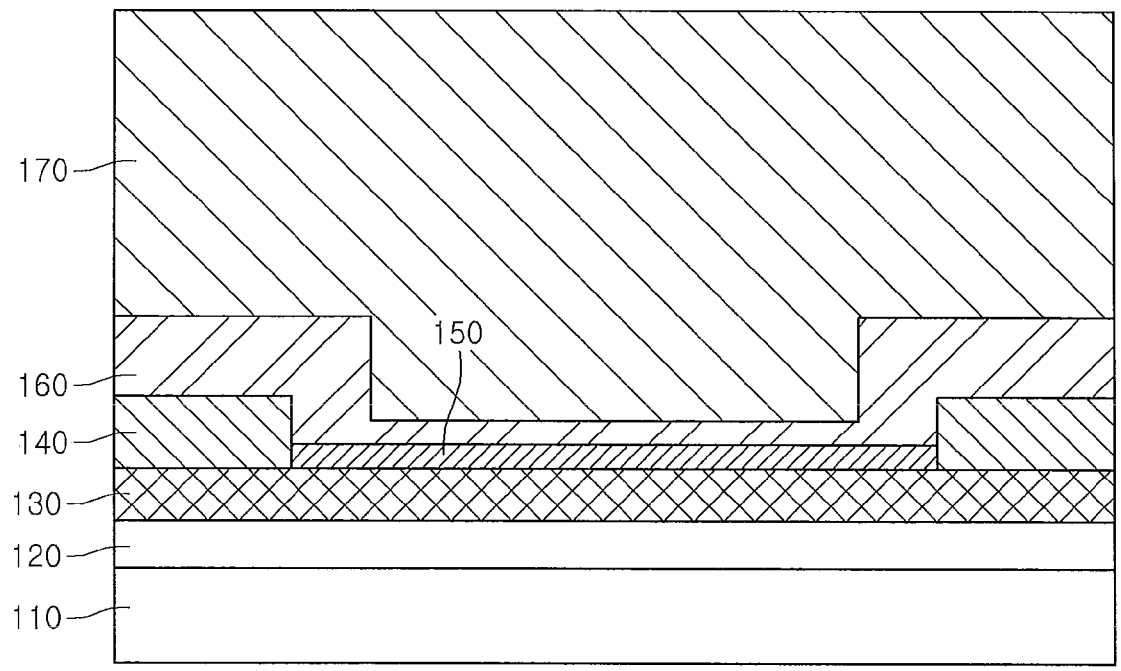

Referring to FIGS. 7 and 8, the substrate 101 is removed, after the conductive supporting member 170 is positioned on a base. The substrate 101 may be removed using a physical and/or chemical method. With the physical method, the substrate 101 is removed through a laser lift off (LLO) process. With the chemical method, the substrate may be separated by removing a semiconductor layer (e.g., a buffer layer) between the substrate 101 and the first conductive type semiconductor layer 110 using a wet etching method.

A polishing process using an inductively coupled plasma/reactive ion etching (ICP/RIE) method may be performed on the first conductive type semiconductor layer 110 of which substrate 101 is removed.

The ohmic contact layer 150 and the second electrode layer 160 may reinforce the adhesion between the second conductive type semiconductor layer 130 and the conductive supporting member 170, thereby protection of the semiconductor light emitting device from the external impact. For example, the layers 150 and 160 between the second conductive type semiconductor layer 130 and the conductive supporting member 170 can be protected from the impact by the substrate removal process as above. Therefore, the electrical reliability of the semiconductor light emitting device can be improved.

Figure 9:
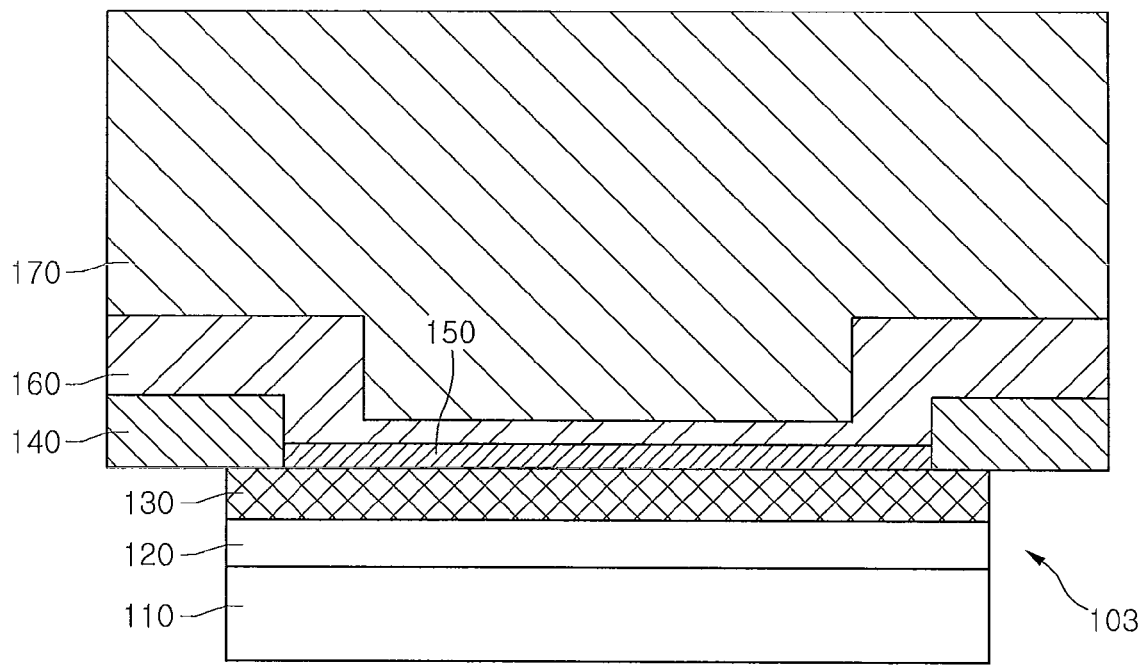

Referring to FIG. 9, the outer part 103 of the second conductive type semiconductor layer 130 is etched through a mesa etching process and thus is removed from the first conductive type semiconductor layer 110. The outer part 103 has an effect that moves the light emitting semiconductor layers 110, 120 and 130 to the inner side of the chip from the boundary area between chips. The protecting layer 140 disposed on the outer side of the top surface of the second conductive type semiconductor layer 130 is exposed to the outer part 103. In other words, the second electrode layer 160 is not exposed to the outer part 103 but the protecting layer 140 is exposed thereto, making it possible to improve chip yield.

Therefore, the protecting layer 140 can solve the problem of an electrical short between the semiconductor layers 110, 120, and 130 due to metallic fragments generated during the chip separation process, when separating one chip from the other chip.

Figure 10:
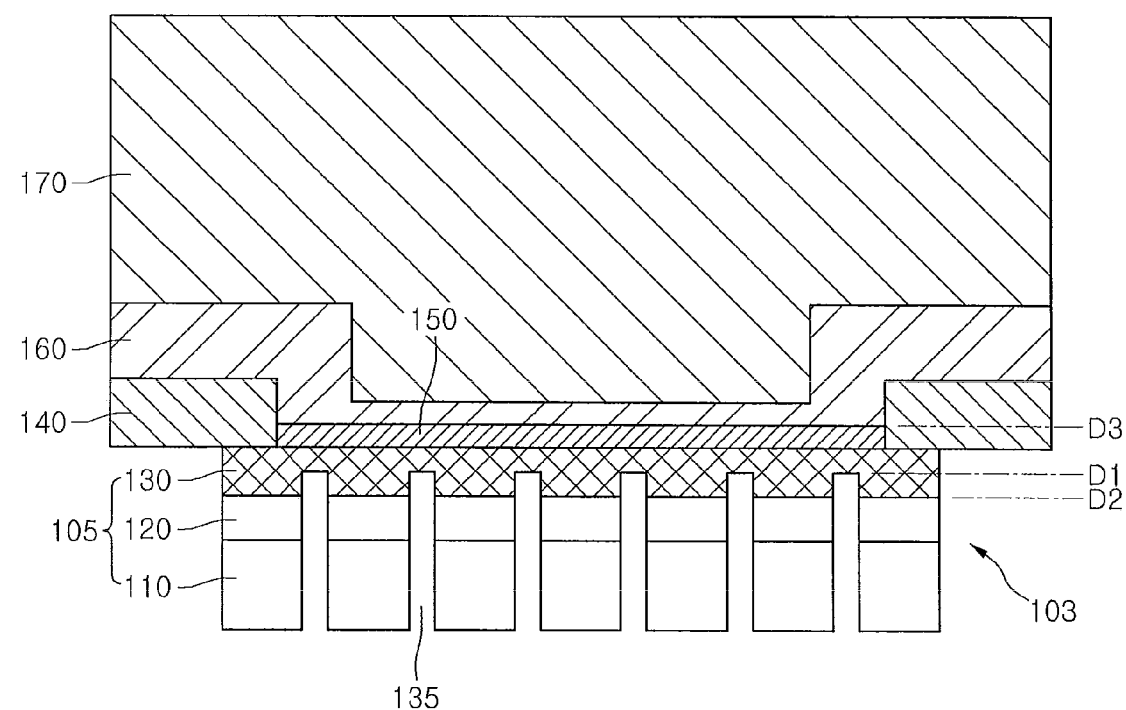

Referring to FIG. 10, structure dividing grooves 135 are formed in the inner side of the first conductive type semiconductor layer 110. The structure dividing groove 135 may be etched at a depth D1 to the extent that the second conductive type semiconductor layer 130 is exposed from the first conductive type semiconductor layer 110. The etching may be performed using a dry and/or a wet etching method, but it is not limited thereto.

The depth D1 of the structure dividing groove 135 may be formed to be deeper than the lower end position D2 of the second conductive type semiconductor layer 130 and to be shallower than the upper end position D3 of the ohmic contact layer 150. The structure dividing groove 135 may be formed having a width of 0.1 um to 100 um.

As shown in FIGS. 2 and 10, the structure dividing grooves 135 may be formed in a shape that the first conductive type semiconductor layer 110 is not separated into two. The structure dividing grooves 135 may be formed in straight line configuration, in a bent configuration (e.g.: L and V), in a branched branch configuration, in a multi-branch windows configuration (e.g.: E and F), in an open type characters configuration (e.g.: Y, N, M, V, T, W, X, Z, C, H, K, etc.), etc., but it is not limited thereto.

The plurality of structure dividing grooves 135 may be in parallel to each other or not, and may be spaced at regular/irregular intervals, but they are not limited thereto.

The light emitting structure 105 may be divided into a plurality of light emitting areas by the structure dividing grooves 135.

When forming the structure dividing groove 135, if the second conductive type semiconductor layer 130 is formed to have a thin thickness of, for example, about 500 Å to 3000 Å, it may be etched more than the thickness of the second conductive type semiconductor layer 130 at the time of excessive etching. At this time, the ohmic contact layer 150 protects the device from the excessive etching. The ohmic contact layer 150 does not generate metallic fragments such as ITO or $SiO_2$ material, making it possible to solve the problem due to the excessive etching.

Herein, if there is no ohmic contact layer 150, the second electrode layer 160 may be etched due to the excessive etching. At this time, a problem arises in that the metallic fragments of the second electrode layer 160 shorts the interlayer of the light emitting structure 105. According to the embodiment, the ohmic contact layer 150 is disposed on the light emitting structure 105, making it possible to prevent the second electrode layer 160 from being etched.

Figure 11:
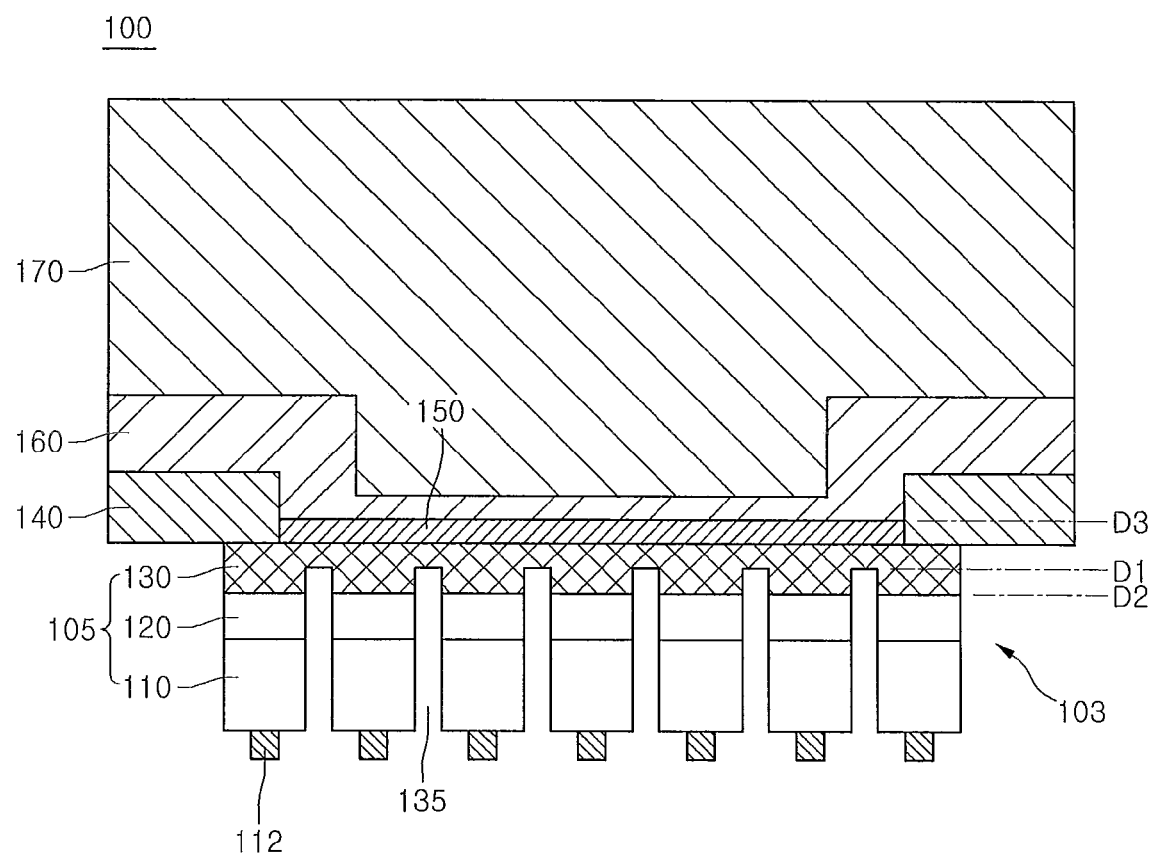

As shown in FIGS. 2 and 11, a plurality of structure dividing groove 135 are formed in a bar shape in the inner side area of the chip, and first electrode 112 is formed under a first conductive type semiconductor layer 110 divided by the structure dividing grooves 135. The first electrode 112 is disposed under the first conductive type semiconductor layer 110 adjacent to the structure dividing grooves 135, respectively.

The first electrode 112 is formed so that current having uniform distribution can be supplied to the respective areas of the light emitting structure 105. Herein, the first electrode 112 may be disposed in various patterns, for example, in a polygonal pattern, in a circular pattern, in a curve pattern, in a straight line pattern, in a multi-branch windows pattern, in a bent-shaped pattern, in a character-shaped pattern (e.g.: O, T, Y, D, B, X, Z, U, P, L, K, M, N, etc.), etc.

A roughness pattern (not shown) may be formed on the bottom surface of the first conductive type semiconductor layer 110, but it is not limited thereto.

Also, a transparent electrode layer such as ITO may be formed on the bottom surface of the first conductive type semiconductor layer 110 and the first electrode 112 may be formed on or under the transparent electrode layer.

Meanwhile, by way of another example, the structure dividing groove 135 may be left as a space or may also be filled with separate insulating material (e.g.: SiO2 and Si3N4) or resin material (e.g.: silicon, epoxy, etc.).

The light emitting structure 105 as described above is divided into a plurality of light emitting areas to minimize light scattering inside the device, making it possible to increase optical efficiency. Also, the semiconductor light emitting device is light emitted through the respective light emitting areas of the light emitting structure 105, making it possible to improve external quantum efficiency.

Figure 12:
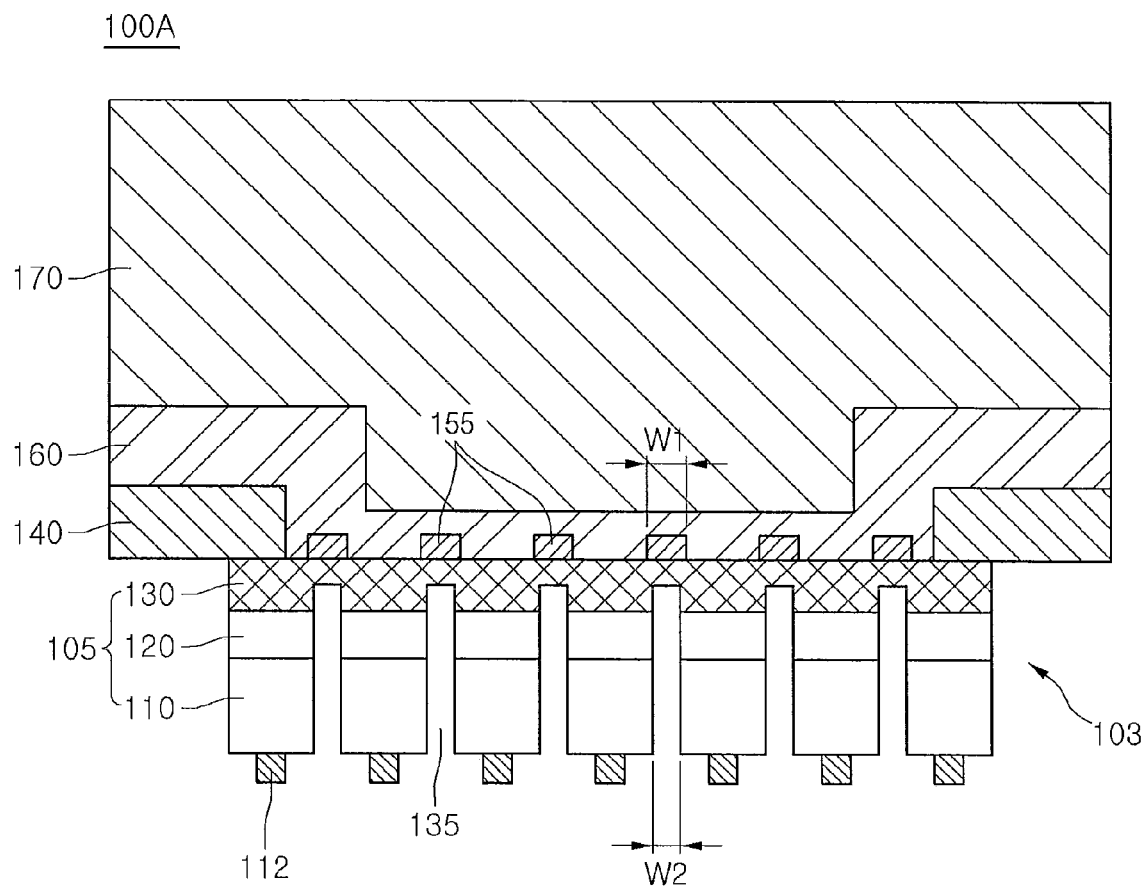
FIG. 12 is a side cross-sectional view showing a semiconductor light emitting device according to the second embodiment.
Figure 13:
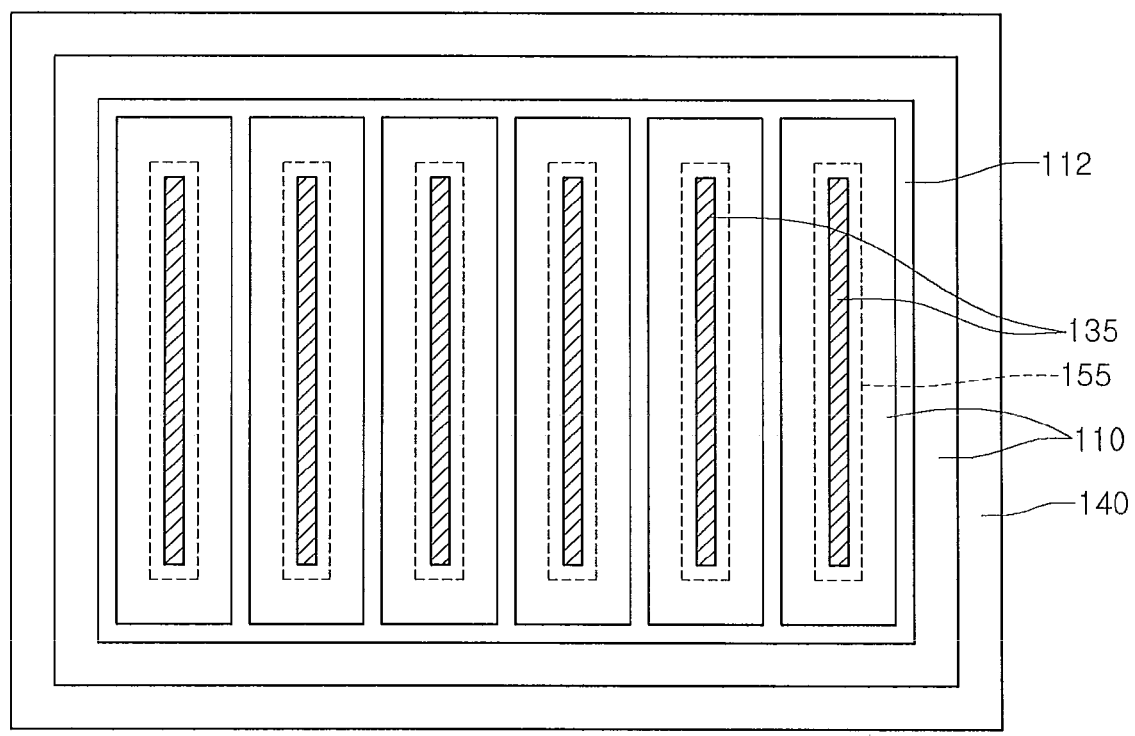
FIG. 13 is a plan view of FIG. 12.

FIG. 12 is a side cross-sectional view showing a semiconductor light emitting device according to the second embodiment, and FIG. 13 is a plan view of FIG. 12. When explaining the second embodiment, the same portions as the first embodiment will use the same reference numerals and the overlapped explanation thereof will be omitted.

Referring to FIGS. 12 and 13, a semiconductor light emitting device 100A comprises an ohmic contact layer 155 in a plural pattern shape formed on the second conductive type semiconductor layer 130.

The ohmic contact layer 155 may be formed in a pattern (e.g.: a bar pattern) corresponding to the structure dividing grooves 135, wherein the width W1 of the ohmic contact layer 155 may be formed to be wider than the width W2 (0.1 um to 100 um) of the structure dividing groove 135, and the length thereof may be formed to be longer than the length of the structure dividing groove 135. In other words, the width W1 and the length of the ohmic contact layer 155 are formed to be larger than those of the structure dividing groove 135, making it possible to prevent the second electrode layer 160 from being exposed even an excessive etching is generated.

The pattern shape of the ohmic contact layer 155 may be formed in a pattern having the size that can cover at least one structure dividing groove 135, but it may be changed within the technical range of the embodiment.

As the ohmic contact layer 155 is formed in a pattern shape, the second conductive type semiconductor layer 130 received power of second polarity through the ohmic contact layer 155 and the second electrode layer 160. In this case, the second conductive type semiconductor layer 130 may receive current diffused by different ohmic resistance.

A current blocking layer (not shown) may be formed in a pattern (e.g.: a bar pattern) corresponding to the structure dividing grooves 135 and disposed between the second conductive type semiconductor 130 and the second electrode layer 160. The current blocking layer can comprise the ohmic contact layer 155. The second conductive type semiconductor layer 130 may receive current diffused by the current blacking layer.

A method for manufacturing a semiconductor light emitting device comprise forming a light emitting structure that includes a plurality of compound semiconductor layers over a substrate; forming an ohmic contact layer on the light emitting structure; forming a second electrode layer on the ohmic contact layer; separating the substrate from the light emitting structure; forming a plurality of dividing grooves that divide the inner area of the light emitting structure into plurality of light emitting areas; and forming first electrodes under the light emitting structure.

According to the embodiment, the inner side of the chip is divided into a plurality of light emitting areas, making it possible to improve external quantum efficiency in the chip that becomes large areas and to minimize the internal light scattering.

Embodiments disposes the ohmic contact layer and/or the between the light emitting structure and the second electrode layer, making it possible to improve chip yield.

Embodiments can improve the electrical reliability of the semiconductor light emitting device. Embodiments can provide a semiconductor light emitting device such as an LED.

According to the embodiments, a light source packaged with the semiconductor light emitting device can be employed in the fields of illumination, indication, display and the like.

In the embodiment, when each layer (film), area, pattern or structures are referred to as being "on" or "under" substrate, each layer (film), region, pad or pattern, it can be understood as the case that each layer (film), an area, a pattern or structures are formed by being directly contacted to each layer (film), the area, the pattern or the structures and it can further be understood as the case that other layer (film), other area, other pattern or other structures are additionally formed therebetween. Also, being "on" or "under" each layer will be described based on the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a conductive supporting member having a top surface and a bottom surface spaced from each other in a vertical direction;
a second electrode layer disposed under the bottom surface of the conductive supporting member, the second electrode layer having a central portion and a peripheral portion;
a protecting layer under the peripheral portion of the second electrode layer;
an ohmic contact layer disposed under a bottom surface of the second electrode layer;
a light emitting structure disposed under a bottom surface of the ohmic contact layer wherein the light emitting structure comprises a first conductive type semiconductor layer disposed under the bottom surface of the ohmic contact layer, a second conductive type semiconductor layer between the first conductive type semiconductor layer and the ohmic contact layer, and an active layer between the first and second conductive type semiconductor layers;
a plurality of grooves disposed in an inner region of the light emitting structure, each groove having a width and an upper surface located between a top surface of the second conductive type semiconductor layer and a bottom surface of the second conductive type semiconductor layer; and
a first electrode disposed under a bottom surface of the light emitting structure,
wherein the ohmic contact layer is formed in a pattern corresponding to the grooves,
wherein a width and a length of the ohmic contact layer is greater than a width and a length of the grooves,
wherein each groove has a total depth from a bottom surface of the first conductive type semiconductor layer to the upper surface of the groove, and
wherein the total depth of the groove is shorter than that of the light emitting structure.

2. The semiconductor light emitting device according to claim 1, wherein the protecting layer comprises at least one of an insulating material and a transparent material, wherein the protecting layer comprises an inner portion between the second conductive type semiconductor layer and the second electrode layer and an outer portion extending outward beyond the top surface of the second conductive type semiconductor layer.

3. The semiconductor light emitting device according to claim 1, wherein the ohmic contact layer is formed in plural bars, and
wherein the second conductive type semiconductor layer directly contact the ohmic contact layer and the second electrode layer.

4. The semiconductor light emitting device according to claim 1, wherein the ohmic contact layer comprises at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

5. The semiconductor light emitting device according to claim 3, wherein the first electrode has an open loop configuration and/or a close loop configuration and is connected to a different region of the bottom surface of the first conductive type semiconductor layer which is divided by the plurality of grooves.

6. A semiconductor light emitting device, comprising:
a conductive supporting member having a top surface and a bottom surface spaced from each other in a vertical direction;
a second electrode layer comprising a reflective electrode disposed under the bottom surface of the conductive supporting member, the second electrode layer having a central portion and a peripheral portion;
a protecting layer under the peripheral portion of the second electrode layer;
an ohmic contact layer disposed under a bottom surface of the second electrode layer;
a light emitting structure disposed under a bottom surface of the ohmic contact layer, wherein the light emitting structure comprises a first conductive type semiconductor layer disposed under the bottom surface of the ohmic contact layer, a second conductive type semiconductor layer between the first conductive type semiconductor layer and the ohmic contact layer, and an active layer between the first and second conductive type semiconductor layers;
a plurality of grooves spaced apart from each other in an inner region of the light emitting structure, each groove having a width and an upper surface located between a top surface of the second conductive type semiconductor layer and a bottom surface of the second conductive type semiconductor layer; and
a first electrode under a bottom surface of the light emitting structure,
wherein the ohmic contact layer is formed in a pattern corresponding to the grooves,
wherein a width and a length of the ohmic contact layer is greater than a width and a length of the grooves,
wherein the plurality of grooves each have a total depth from a bottom surface of the first conductive type semiconductor layer to the upper surface of the groove, the plurality of grooves being in the second conductive type semiconductor layer,
wherein the total depth of each of the grooves is shorter than that of the light emitting structure, and
wherein the conductive supporting member has a width wider than that of the light emitting structure.

7. The semiconductor light emitting device according to claim 6, wherein the ohmic contact layer is formed in plural bars, and the plurality of grooves comprise insulating material or resin material therein.

8. The semiconductor light emitting device according to claim 6, wherein the protecting layer comprises at least one of an insulating material and a transparent material,
wherein the protecting layer comprises an inner portion between the second conductive type semiconductor layer and the second electrode layer and an outer portion extending outward beyond the top surface of the second conductive type semiconductor layer.

9. The semiconductor light emitting device according to claim 6, wherein the groove has the depth that the second conductive type semiconductor layer is exposed on the inner region of the light emitting structure, having at least one configuration of a straight line configuration, a bent configuration, a branched branch configuration, a multi-branch windows configuration, an open type characters configuration.

10. The semiconductor light emitting device according to claim 8, wherein the protecting layer comprises at least one of SiOx, SiNx, $Al_2O_3$, $TiO_2$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

11. A semiconductor light emitting device, comprising:
a conductive supporting member having a top surface and a bottom surface spaced from each other in a vertical direction;
a second electrode layer comprising a reflective electrode disposed under a bottom surface of the conductive supporting member, the second electrode layer having a central portion and a peripheral portion;
a protecting layer under the peripheral portion of the second electrode layer;
an ohmic contact layer disposed in the central portion of the second electrode layer;
a light emitting structure disposed under a bottom surface of the ohmic contact layer, wherein the light emitting structure comprises a first conductive type semiconductor layer disposed under the bottom surface of the ohmic contact layer, a second conductive type semiconductor layer between the first conductive type semiconductor layer and the ohmic contact layer, and an active layer between the first and second conductive type semiconductor layers; and
a plurality of grooves spaced from each other in an inner region of the light emitting structure, each groove having a width and an upper surface located between a top surface of the second conductive type semiconductor layer and a bottom surface of the second conductive type semiconductor layer,
wherein the ohmic contact layer is formed in a pattern corresponding to the grooves,
wherein a width and a length of the ohmic contact layer is greater than a width and a length of the grooves,
wherein the plurality of grooves has a total depth from a bottom surface of the first conductive type semiconductor layer to the upper surface of the groove, and
wherein the total depth of each of the grooves is shorter than that of the light emitting structure, wherein the conductive supporting member and the second electrode layer have a width wider than that of the light emitting structure, and wherein the first conductive type semiconductor layer includes an n-type dopant and the second conductive type semiconductor layer includes a p-type dopant.

12. The semiconductor light emitting device according to claim 11, wherein the protecting layer comprises at least one of an insulating material and a transparent material, and wherein the protecting layer comprises an inner portion between the second conductive type semiconductor layer and the second electrode layer and an outer portion extending outward beyond the top surface of the second conductive type semiconductor layer.

13. The semiconductor light emitting device according to claim 11, wherein the ohmic contact layer is formed in a plurality of bars that correspond to the plurality of grooves.

14. The semiconductor light emitting device according to claim 12, wherein the ohmic contact layer and the protecting layer comprise at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

15. The semiconductor light emitting device according to claim 1, wherein the first electrode comprises a plurality of portions facing each other on the bottom surface of the light emitting structure, and wherein an interval between the plurality of portions is a wider than a width of the groove.

16. The semiconductor light emitting device according to claim 1, wherein each groove is spaced apart from a plurality of side surfaces of the light emitting structure and the bottom surface of the light emitting structure.

17. The semiconductor light emitting device according to claim 3, wherein each of the plural bars has a width wider than that of the groove.

18. The semiconductor light emitting device according to claim 1, wherein the first conductive type semiconductor layer includes an n-type dopant and the second conductive type semiconductor layer includes a p-type dopant.

* * * * *